(12) United States Patent  (10) Patent No.: US 7,244,520 B2
Kumakura et al.  (45) Date of Patent: Jul. 17, 2007

(54) SUBSTRATE FOR NITRIDE SEMICONDUCTOR GROWTH

(75) Inventors: Kazuhide Kumakura, Zama (JP); Masanobu Hiroki, Sagamihara (JP); Toshiki Makimoto, Kawasaki (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 10/532,782

(22) PCT Filed: Aug. 11, 2004

(86) PCT No.: PCT/JP2004/011539

§ 371 (c)(1),
(2), (4) Date: Apr. 25, 2005

(87) PCT Pub. No.: WO2005/015618

PCT Pub. Date: Feb. 17, 2005

(65) Prior Publication Data

US 2006/0051554 A1  Mar. 9, 2006

(30) Foreign Application Priority Data

Aug. 12, 2003 (JP) ............... 2003-292350

(51) Int. Cl.
*B32B 9/00* (2006.01)
(52) U.S. Cl. ............... 428/701; 428/702; 428/698
(58) Field of Classification Search .......... None
See application file for complete search history.

(56) References Cited

U.S. PATENT DOCUMENTS 5,741,724 A * 4/1998 Ramdani et al. ......... 438/46
6,362,515 B2 * 3/2002 Hayakawa .............. 257/639
6,744,076 B2 * 6/2004 Fukuyama et al. ........ 257/103

FOREIGN PATENT DOCUMENTS

| JP | 02-141495 | 5/1990 |
|---|---|---|
| JP | 11-060395 | 3/1999 |
| JP | 11-340147 | 12/1999 |
| WO | WO 02/12598 A1 | 2/2002 |

OTHER PUBLICATIONS

Cho et al., "Effects of N+-implanted sapphire (0001) substrate on GaN epilayer". Journal of Crystal Growth, vol. 236, Issue 4, Mar. 2002, pp. 538-544.*

(Continued)

*Primary Examiner*—Jennifer McNeil
*Assistant Examiner*—Jonathan Langman
(74) *Attorney, Agent, or Firm*—Workman Nydegger (57) ABSTRACT

A substrate for growth of nitride semiconductor capable of obtaining a high-quality nitride semiconductor crystal layer is provided. A substrate for growth of nitride semiconductor for growth of a nitride semiconductor layer on a sapphire substrate (1) according to one embodiment of the invention is provided with an $Al_2O_3$ layer (2) as separately provided on the sapphire substrate (1), an AlON layer (3) which is the first layer, and an AlN layer (4) which is the second layer. With respect to the first layer and the second layer, the AlON layer (3) and the AlN layer (4) are deposited on the $Al_2O_3$ layer (2) in this order.

8 Claims, 6 Drawing Sheets

OTHER PUBLICATIONS

Liu et al., "Substrates for gallium nitride epitaxy". Materials Science and Engineering: R: Reports, vol. 37, Issue 3, Apr. 30, 2002, pp. 61-127.*

Hyun-Jeong Kim et al., *Effects of Reactive Ion Beam Treatment of a Sapphire Surface to Optimite the Deposition of GaN Films*, Journal of Applied Physics, vol. 87, No. 11, Jun. 1, 2000, pp. 7940-7945.

Cyril Pernot et al., *Low-Intensity Ultraviolet Photodetectors Based on AlGaN*, Japanese Journal Applied Physics, vol. 38, 1999, pp. L487-L489.

H. Amano et al., *Metalorganic Vapor Phase Epitaxial Growth of a High Quality GaN Film Using an AlN Buffer Layer*, Applied Physics Letters, vol. 48, No. 5, Feb. 3, 1986, pp. 353-355.

Shuji Nakamura, *GaN Growth Using GaN Buffer Layer*, Japanese Journal of Applied Physics, vol. 30, No. 10A, Oct. 1991, pp. L1705-L1707.

* cited by examiner

SUBSTRATE FOR NITRIDE SEMICONDUCTOR GROWTH

TECHNICAL FIELD

The present invention relates to a substrate for growth of nitride semiconductor to be used for growth of a nitride semiconductor on a sapphire substrate.

BACKGROUND ART

Since nitride semiconductors have a band gap in the far infrared to ultraviolet wavelength region, they are promising as a material of light emitting or light receiving devices in that region. Also, the nitride semiconductors have a wide band gap and have a large breakdown field and a high saturation electron velocity. For that reason, the nitride semiconductors are also very promising as materials of electronic devices with high-temperature, high output power and high frequency operation. Further, since the nitride semiconductors do not contain arsenic (As) and phosphorus (P), as compared with GaAs based or InP based semiconductors which have hitherto been utilized, they have a merit that they are harmless against the environment and are expected as a semiconductor device material in the future.

As a substrate for epitaxial growth of nitride semiconductor having such excellent characteristics, any material having a lattice constant and a coefficient of thermal expansion equal to those of the nitride semiconductors has not been available yet. For that reason, sapphire, SiC, or Si is mainly used as the substrate.

For epitaxial growth of GaN, AlN, InN and their alloyed crystals, a sapphire substrate has hitherto been mainly used. However, there are lattice mismatch of 11 to 23% and a difference in the coefficient of thermal expansion between the sapphire substrate and the nitride semiconductor. Accordingly, if the nitride semiconductor is grown directly on the sapphire substrate, the three-dimensional growth occurs so that the flatness of the surface in an atomic level becomes worse. For that reason, there was a problem that the nitride semiconductor grown on the sapphire substrate has a number of crystal defects.

In the case of the epitaxial growth of a nitride semiconductor on the sapphire substrate, it has been reported that crystallinity of GaN was improved by a method using a buffer layer. Its technologies will be described below.

The first is a growth method of GaN using a low-temperature AlN buffer layer (see the following Non-Patent Document 1). This method is as follows. The sapphire substrate was heated up to the temperature around 1000° C. for surface cleaning in metalorganic vapor phase epitaxy system etc., the temperature was then once dropped. Next, a low-temperature AlN buffer layer was deposited at around 500° C., and the temperature is again raised. Then, GaN was grown at around 1000° C. The ALN buffer layer deposited by this method is amorphous and the islands were formed during the temperature rising step due to the solid phase growth of amorphous AlN. As a matter of course, the island shape to be formed varies depending upon the atmosphere in the growth system (apparatus) or the temperature rising rate during the temperature rising. At the beginning of growth of the GaN layer at high temperatures, this island becomes a nucleus, whereby the GaN layer undergoes crystal growth. During that crystal growth, flattening of the GaN layer advances due to the coalescence. GaN undergoes two-dimensional crystal growth on the flattened GaN layer.

The second is a growth method of GaN using a low-temperature GaN buffer layer (see the following Non-Patent Document 2). This method is as follows. The sapphire substrate was heated up to the temperature around 1000° C., the temperature was then once dropped. Next, a low-temperature GaN buffer layer was deposited at around 500° C., and the temperature is again raised. Then, GaN was grown at around 1000° C. Since GaN is decomposed easily at high temperature as compared with AlN, the nucleus formation in the temperature rising step is not always the same as in the case of AlN, but the subsequent growth process is substantially the same.

Incidentally, in the crystal growth of nitride semi-conductors other than GaN, the same methods as in those described previously are applicable, too. For example, in growth of $Al_{1-x}Ga_xN$ ($0 \leq x < 1$) or $In_{1-x}Ga_xN$ ($0 \leq x < 1$) crystals, a low-temperature GaN buffer layer is deposited on the sapphire substrate, then GaN, and $Al_{1-x}Ga_xN$ or $In_{1-x}Ga_xN$ was grown. In particular, a method of growth of $Al_{1-x}Ga_xN$ crystals is described in the following Non-Patent Document 3.

As described previously, in all of these growth methods, the buffer layer was aimed to achieve lattice matching with the GaN layer, but lattice matching with the substrate was not taken into consideration.

Also, even if the buffer layer is deposited at a low temperature, the low-temperature buffer layer is amorphous and solid phase growth occurs at the time of temperature rising. For that reason, the lattice mismatch between the buffer layer and the substrate still exists, it is difficult to effectively suppress the generation of crystal defects, and threading dislocation of $10^9$ to $10^{10}$ cm$^{-2}$ exists usually. It is well known that this dislocation deteriorates the characteristics of a fabricated device. For example, shortening of the life of laser and an increase of leak current and a lowering of breakdown voltage of the device. Also, diffusion or segregation of impurities may possibly be promoted due to the existence of the dislocation. Accordingly, reducing the dislocation density in the nitride semiconductor layer is very important for improving the device characteristics, realizing devices which have not been attained so far due to influences of the dislocation and enhancing the controllability in fabrication of a device structure in crystal growth.

Accordingly, the invention is aimed to provide a substrate for growth of a nitride semiconductor capable of obtaining a high quality nitride semiconductor crystal layer.

Figure 6:
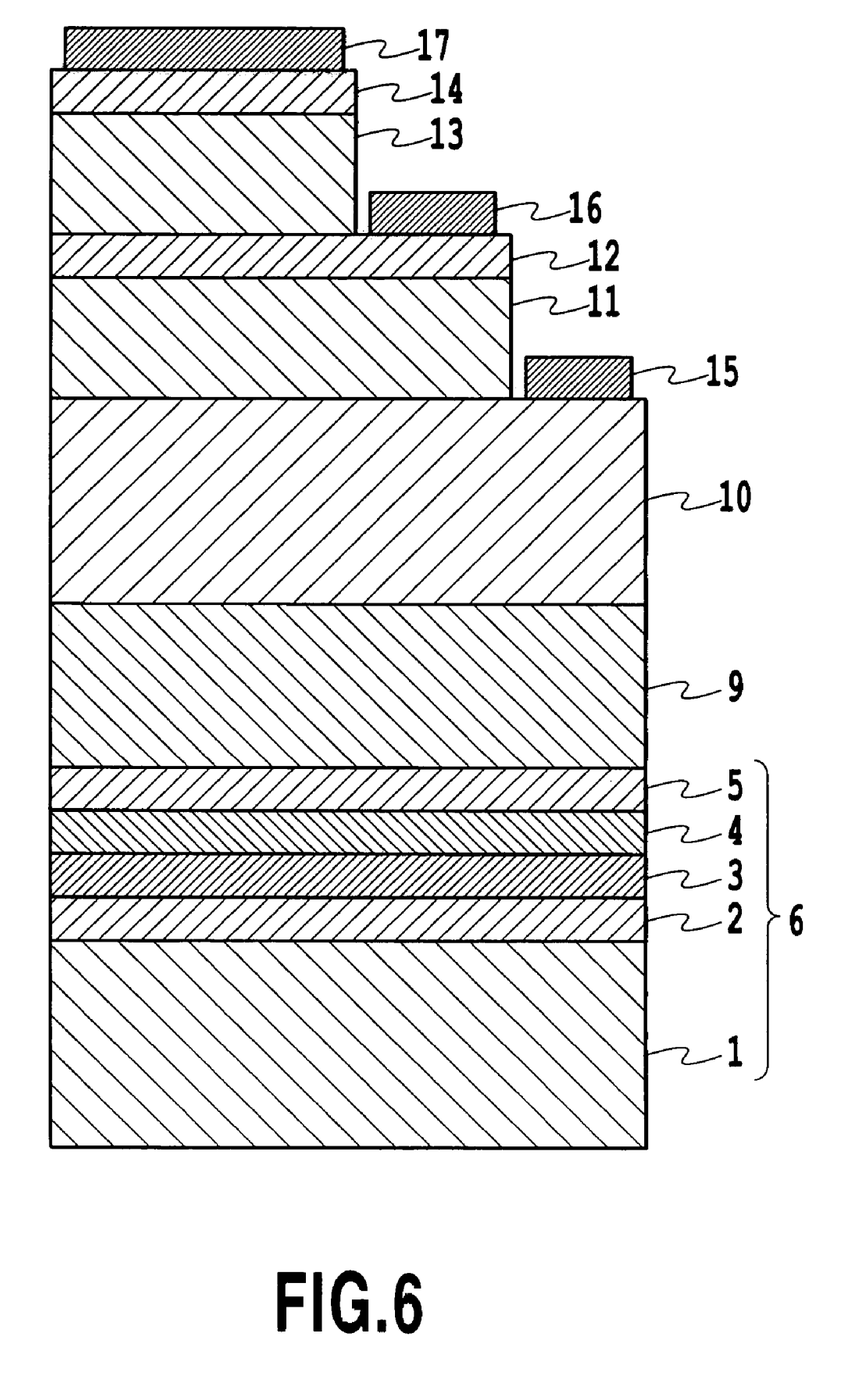
FIG. 6 is a cross-sectional schematic view of an $Al_{1-x}Ga_xN$ ($0 \leq x<1$)/GaN heterojunction bipolar transistor structure epitaxially grown on a substrate for growth of nitride semiconductor according to one embodiment of the invention.

Non-Patent Document 1:

H. Amano, N. Sawaki, I. Akasaki, and Y. Toyoda, "Meta illustrated in the foregoing embodiment, the GaN buffer layer 9 (thickness: 1 μm), the n$^+$-type GaN subcollector layer 10 (thickness: 1 μm), the n$^-$-type GaN collector layer 11 (thickness: 0.5 μm), the p-type GaN base layer 12 (thickness: 0.08 μm), the n$^-$-type $Al_{1-x}Ga_xN$ emitter layer 13 ($0 \leq x < 1$) (thickness: 0.05 μm), and the n$^+$-type GaN contact layer 14 (thickness: 0.1 μm) were grown by the metalorganic vapor phase epitaxy. In this case, the growth sequence is a method in which the substrate 6 for growth of nitride semiconductor was introduced into a growth furnace, the temperature was then raised to the growth temperature (1,000° C.) under an ammonia atmosphere, and a source material gas was supplied. Trimethylgallium, trimethylaluminum and ammonia are used as the source materials. For dopant of n-type impurities, a Si was used. For dopant of p-type impurities, Mg was used. A mesa structure was prepared by etching, and ohmic electrodes, i.e., the collector electrode 15, the base electrode 16, and the emitter electrode 17, were formed on the each exposed layers by means of electron beam metal deposition. In a collector current-collector voltage characteristic in common emitter configuration of a fabricated transistor, current gain of approximately 100 was obtained, and the breakdown voltage was increased to approximately 200 V with a reduction of the dislocation density as described already being reflected.

DISCLOSURE OF THE INVENTION

One embodiment of the invention is concerned with a substrate for growth of nitride semiconductor to be used for growth of a nitride semiconductor layer on a sapphire substrate, wherein the substrate is provided with layers containing N, O and Al as separately provided on the sapphire substrate. This layer comes into contact with the sapphire substrate at the first surface thereof. Also, the foregoing layer is formed such that the proportion of N to the composition ratio of N, O and Al in the first surface is smaller than that of N to the composition ratio of N, O and Al in the second surface coming into contact with a nitride semiconductor layer and that the proportion of O to the composition ratio in the first surface is larger than that of O to the composition ratio in the second surface.

Another embodiment is concerned with a substrate for growth of nitride semiconductor to be used for growth of a nitride semiconductor layer on a sapphire substrate, wherein the substrate is provided with an $Al_2O_3$ layer as separately provided on the sapphire substrate and either one layer of an AlON layer or an AlN layer provided on the $Al_2O_3$ layer.

A still another embodiment is concerned with a substrate for growth of nitride semiconductor to be used for growth of a nitride semiconductor layer on a sapphire substrate, wherein the substrate is provided with an $Al_2O_3$ layer as separately provided on the sapphire substrate, an AlON layer which is the first layer, and an AlN layer which is the second layer, and has a structure in which the first layer and the second layer are formed on the $Al_2O_3$ layer in this order.

Here, a cap layer made of $Al_2O_3$ can be provided as the uppermost layer of the substrate for growth of nitride semiconductor.

According to the embodiments of the invention as described previously, it is possible to provide a substrate for growth of nitride semiconductor capable of obtaining a high-quality nitride semiconductor crystal layer.

BEST MODE FOR CARRYING OUT THE INVENTION

The embodiments of the invention will be described below in detail with reference to the drawings. Incidentally, in the drawings as described hereinafter, a member having the same functions is given the same symbol, and its explanation is omitted.

EMBODIMENTS

Figure 1:
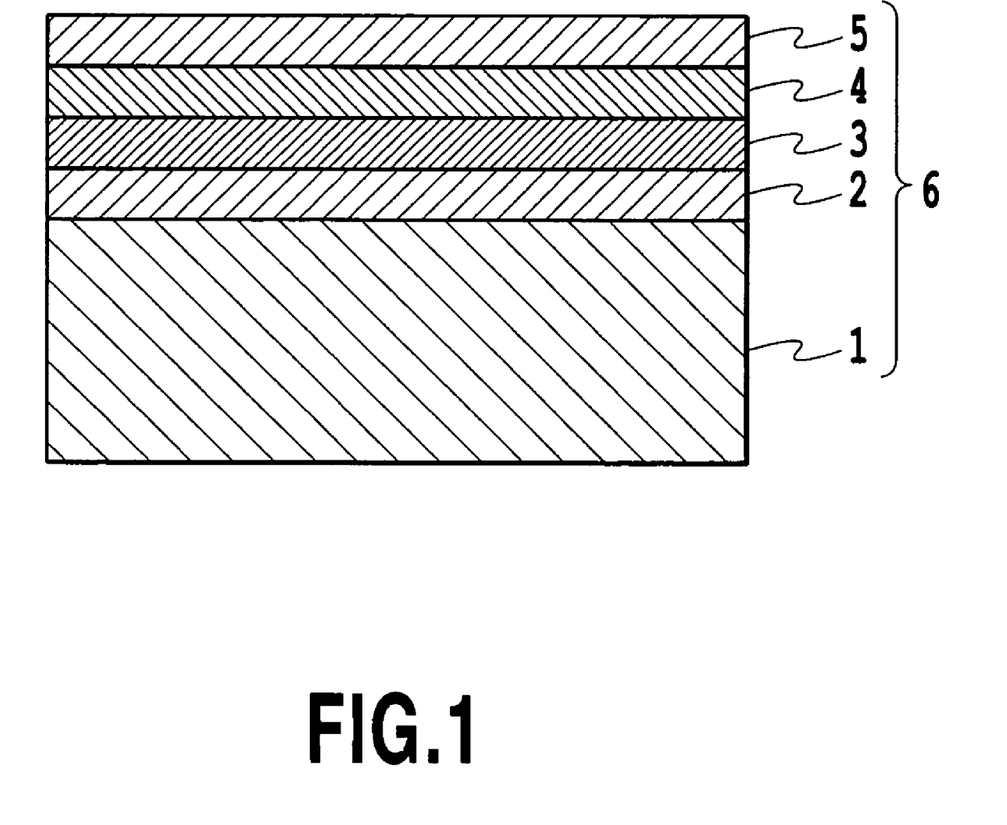
FIG. 1 is a cross-sectional schematic view of a substrate for growth of nitride semiconductor according to one embodiment of the invention.

FIG. 1 is a cross-sectional schematic view of a substrate for growth of nitride semiconductor according to the embodiment of the invention.

In FIG. 1, reference numeral 1 denotes a sapphire substrate (a sapphire single crystal substrate); reference numeral 2 denotes an $Al_2O_3$ layer (an aluminum oxide layer, namely an alumina layer); reference numeral 3 denotes an AlON layer (an aluminum oxynitride layer); reference numeral 4 denotes an AlN layer (an aluminum nitride layer); reference numeral 5 denotes a cap layer (the uppermost layer) made of $Al_2O_3$; and reference numeral 6 denotes a substrate for growth of nitride semiconductor.

This embodiment is concerned with a substrate for growth of nitride semiconductor to be used for growth of a nitride semiconductor layer on the sapphire substrate 1 and has a structure having the $Al_2O_3$ layer 2 which is separately provided on the sapphire substrate 1, the AlON layer 3 which is the first layer, and the AlN layer 4 which is the second layer, and the AlON layer 3 and the AlN layer 4 are formed on the foregoing $Al_2O_3$ layer 4 in this order. Incidentally, even a structure in which either one layer of the AlON layer 3 as the first layer or the AlN layer 4 as the second layer, each having a composition closed to the nitride semiconductor layer, is provided on the $Al_2O_3$ layer 2, gives rise the effects according to the invention and is effective. Also, the cap layer 5 made of $Al_2O_3$ is provided as the uppermost layer of the substrate 6 for growth of nitride semiconductor.

Incidentally, though the foregoing $Al_2O_3$ layer 2 is not always crystalline, it is considered that in the layers, a portion in the crystalline state is lattice-matched with the sapphire substrate 1. The terms "lattice-matched" as referred to herein means that the lattice constant is substantially equal.

That is, on the sapphire substrate 1 having a diameter of 2 inches, the $Al_2O_3$ layer 2 was deposited in a thickness of approximately 5 nm in an Ar plasma at room temperature using Al and oxygen as the sources by an ECR (Electron Cyclotron Resonance) plasma deposition system. Thereafter, nitrogen was added in the deposition chamber, thereby depositing the AlON layer 3 in a thickness of approximately 10 nm. Next, the AlN layer 4 of the same kind as a nitride semiconductor layer (for example, a GaN layer) to be grown on the substrate 6 for growth of nitride semiconductor was deposited in a thickness of approximately 10 nm in an Ar plasma using Al and nitrogen as the sources. Finally, for the purpose of preventing irregular native oxidation which generates surface instability due to stoichiometric disorder, the cap layer 5 made of $Al_2O_3$ was deposited in a thickness of approximately 5 nm in an Ar plasma using Al and oxygen as the sources. There was thus prepared the substrate 6 for growth of nitride semiconductor.

Incidentally, in the foregoing embodiment of the invention, the each layers are formed at room temperature (for example, 20° C.), but the invention is not limited to this temperature. According to one embodiment of the invention, it is important that the substrate for growth of nitride semiconductor according to the invention can be formed even at room temperature, and with respect to the each layers according to one embodiment of the invention, so far as a proper composition of nitrogen and oxygen can be formed, the temperature may be higher or lower than room temperature (the temperature in the atmosphere).

Also, with respect to the film thickness of the $Al_2O_3$ layer 2, the AlON layer 3 and the AlN layer 4, a thickness at which the film can be formed is necessary, and taking into consideration the lattice constant in the c axis of each compound, a single atomic layer is necessary at the minimum. On the other hand, since each layer of the $Al_2O_3$ layer 2, the AlON layer 3 and the AlN layer 4 is not always crystalline (polycrystalline or amorphous), when the film thickness is too thick, it becomes difficult to transfer (epitaxially grow) the crystallographic axis of the sapphire (single crystal) substrate to the nitride semiconductor. In the invention, taking into consideration these matters, it is preferable that the thickness of the $Al_2O_3$ layer 2, the AlON layer 3 and the AlN layer 4 is from approximately 1 nm to 200 nm; and it is more preferable that the thickness of the $Al_2O_3$ layer 2 is from 2 nm to 20 nm, the thickness of the AlON layer 3 is from 2 nm to 70 nm, and the thickness of the AlN layer 4 is from 2 nm to 50 nm.

Moreover, in the embodiment of the invention, the film formation of the each layers is carried out by the ECR plasma deposition system (apparatus), but the invention is not limited thereto. Any apparatus, for example, a MOVPE system having oxygen introduced thereinto, can be employed so far as the film formation of the each layers according to one embodiment of the invention can be properly carried out.

Next, the experimental results which prove usefulness of the substrate for growth of nitride semiconductor of the invention will be described below.

Figure 2:
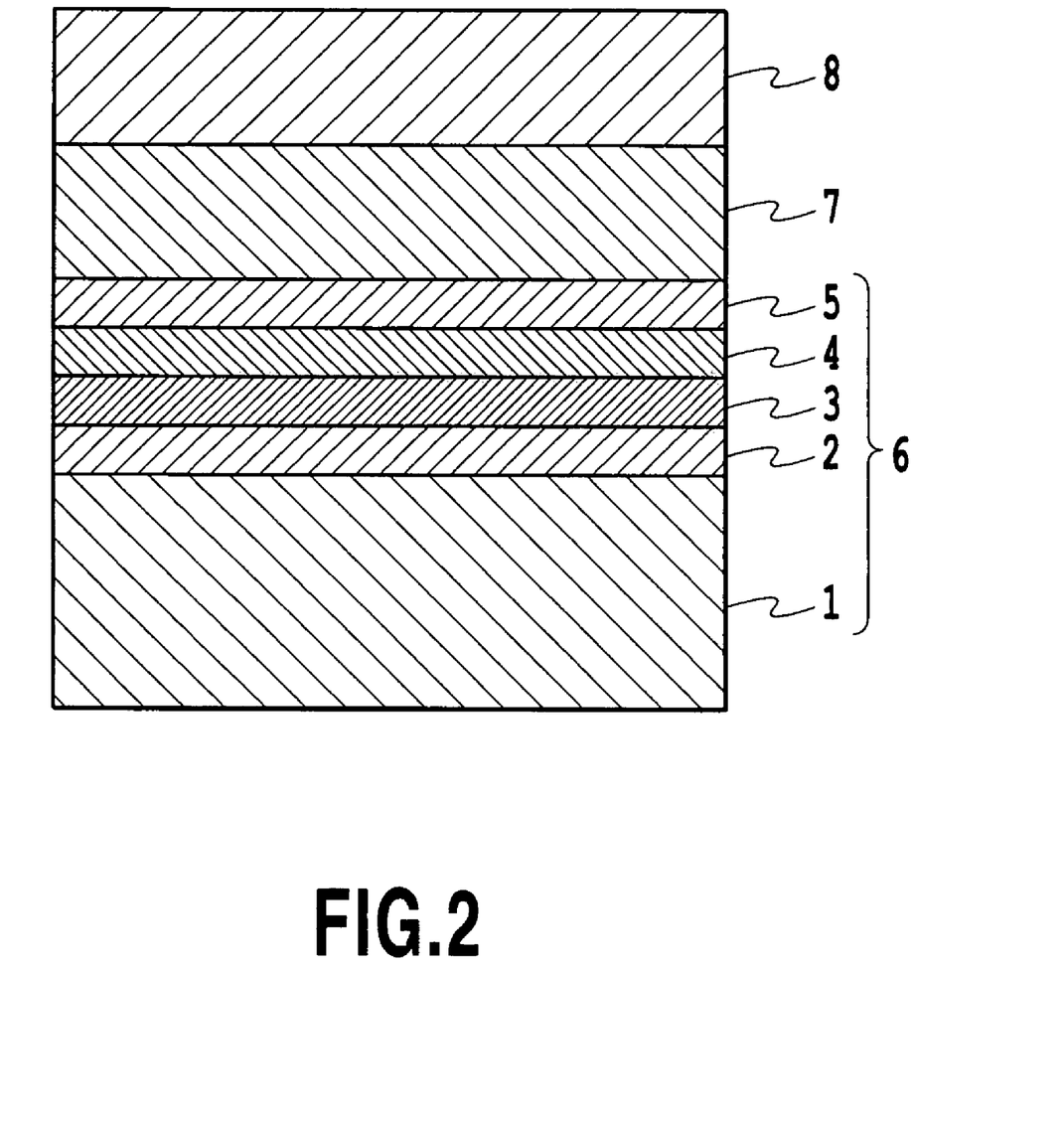
FIG. 2 is a cross-sectional schematic view of a structure in which a GaN layer was epitaxially grown on a substrate for growth of nitride semiconductor according to one embodiment of the invention.

FIG. 2 is a cross-sectional schematic view of a structure in which a GaN layer was epitaxially grown on the substrate for growth of nitride semiconductor of the invention.

In FIG. 2, reference numeral 7 denotes a GaN layer, and reference numeral 8 denotes an Si-doped n-type GaN layer for measuring conductivity. On the substrate 6 for growth of nitride semiconductor as illustrated in the foregoing embodiment, the GaN layer 7 was grown by the metalorganic vapor phase epitaxy. In this case, the growth sequence is a simple method in which the substrate 6 for growth of nitride semiconductor was introduced into a growth furnace, and thereafter, the temperature was raised to the growth temperature (1,000° C.) under an ammonia atmosphere, thereby growing the GaN layers 7 and 8. Trimethylgallium and ammonia were used as the source materials. For doping n-type impurities of the Si-doped n-type GaN layer 8, a silane was used, thereby forming the Si-doped n-type GaN layer 8.

The grown GaN layers 7 and 8 were subjected to X-ray diffraction measurement and Hall effect measurement, thereby evaluating crystallinity and electric characteristics. The evaluation of crystallinity of the grown GaN layer 7 was carried out by estimating a dislocation density in the crystal from a full width at half maximum of X-ray asymmetric reflection spectrum from (10-10). As a result of estimating the dislocation density, the dislocation density of the related art was approximately $2 \times 10^9$ $cm^{-2}$. On the other hand, in the case of the GaN layer 7 prepared using the substrate 6 for growth of nitride semiconductor of the foregoing embodiment, the discoloration density was $9 \times 10^7$ $cm^{-2}$ and largely reduced. Also, as a result of the Hall effect measurement, the carrier density and mobility of the related art were $3 \times 10^7$ $cm^{-3}$ and 340 $cm^2/Vs$, respectively. On the other hand, the carrier density and mobility of the GaN layer 7 prepared using the substrate 6 for growth of nitride semiconductor of the foregoing embodiment were $2 \times 10^{17}$ $cm^{-3}$ and 540 $cm^2/Vs$, respectively, and it became clear that the characteristics were largely improved.

In the light of the above, according to the substrate for growth of nitride semiconductor having the each layers of the invention, since the composition of nitrogen and oxygen (ratio of the constitutional atoms) is changed from the each layers which are not always crystalline but are a layer for the purpose of achieving lattice matching with the sapphire single crystal toward the nitride semiconductor to be grown, the lattice spacing or distance between constitutional atoms in each layer changes, and the threading dislocation into the nitride semiconductor crystal is largely reduced as compared with the related art. Accordingly, it is possible to easily prepare a crystal having a dislocation density in the order of $10^7$ $cm^{-2}$. Namely, in the invention, since the dislocation density can be uniformly reduced over the whole of the substrate surface, it is possible to design to improve the crystallinity of the nitride semiconductor layer, and such is very industrially effective. Also, since an improvement of the crystallinity is anticipated with a reduction of the dislocation density, various ripple effects including an improvement of the device characteristics and realization of new devices are expected.

Incidentally, the substrate for growth of nitride semiconductor of the invention can also be applied to the growth of crystal of nitride semiconductors other than GaN, $Al_{1-x}Ga_xN$ ($0 \leq x < 1$), $In_{1-x}Ga_xN$ ($0 \leq x < 1$), AlN, InN, etc. Also, the applicable nitride semiconductor layer does not rely upon the presence or absence of doping of impurities, the polarity of a carrier of the semiconductor doped with impurities, and the composition ratio of a alloyed crystal.

As the general lattice constants of various constitutional elements, etc. of the substrate 6 for growth of nitride semiconductor in the foregoing embodiment, the following values are known.

Sapphire and $Al_2O_3$: a=4.758 angstrom, c=12.991 angstrom

AlN: a=3.112 angstrom, c=4.982 angstrom

GaN: a=3.189 angstrom, c=5.185 angstrom

That is, with respect to the each layers in the substrate 6 for growth of nitride semiconductor in the foregoing embodiment, since the composition of oxygen and nitrogen (ratio of the constitutional atoms) is changed from the sapphire substrate 1 into, for example, an oxide, an oxynitride, and a nitride, the lattice spacing or distance between constitutional atoms in each layer changes.

In the light of the above, the invention is concerned with the substrate 6 for growth of nitride semiconductor capable of easy growth of a nitride semiconductor having high-quality crystallinity to crystal growth. For achieving this matter, the invention is characterized in that in the buffer layer to be formed on the sapphire substrate 1, the composition of the buffer layer is changed from the surface contacting with the sapphire substrate 1 toward the surface contacting with the nitride semiconductor layer. By changing the composition (ratio of the constitutional atoms) of the buffer layer, the lattice spacing or distance between constitutional atoms of the buffer layer changes.

Figure 3:
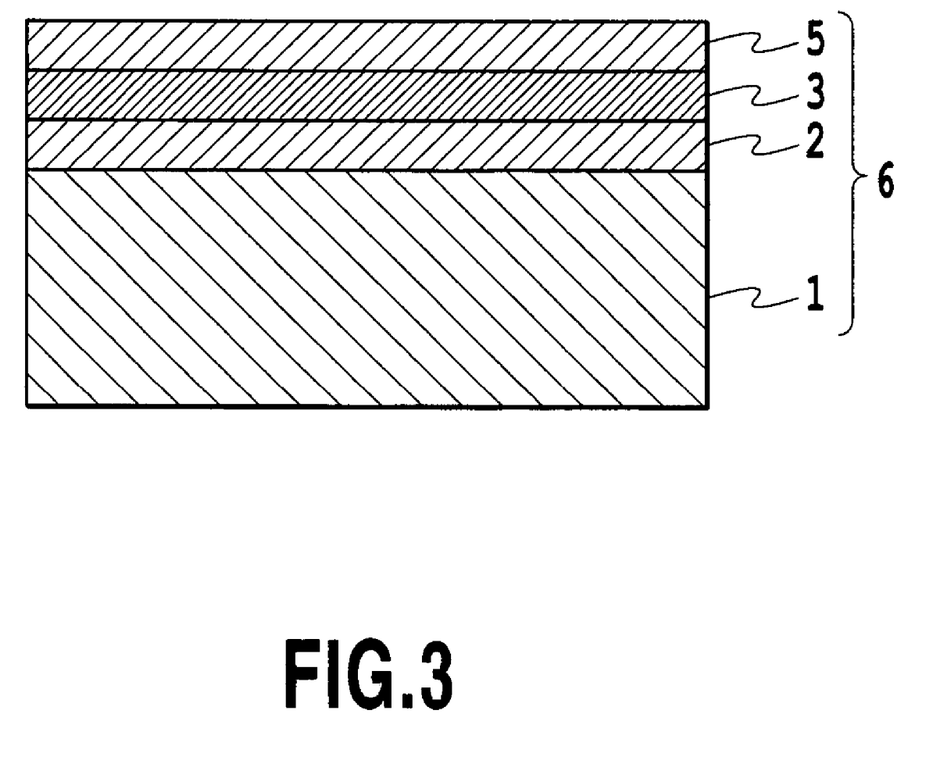
FIG. 3 is a cross-sectional schematic view of a substrate for growth of nitride semiconductor according to one embodiment of the invention.
Figure 4:
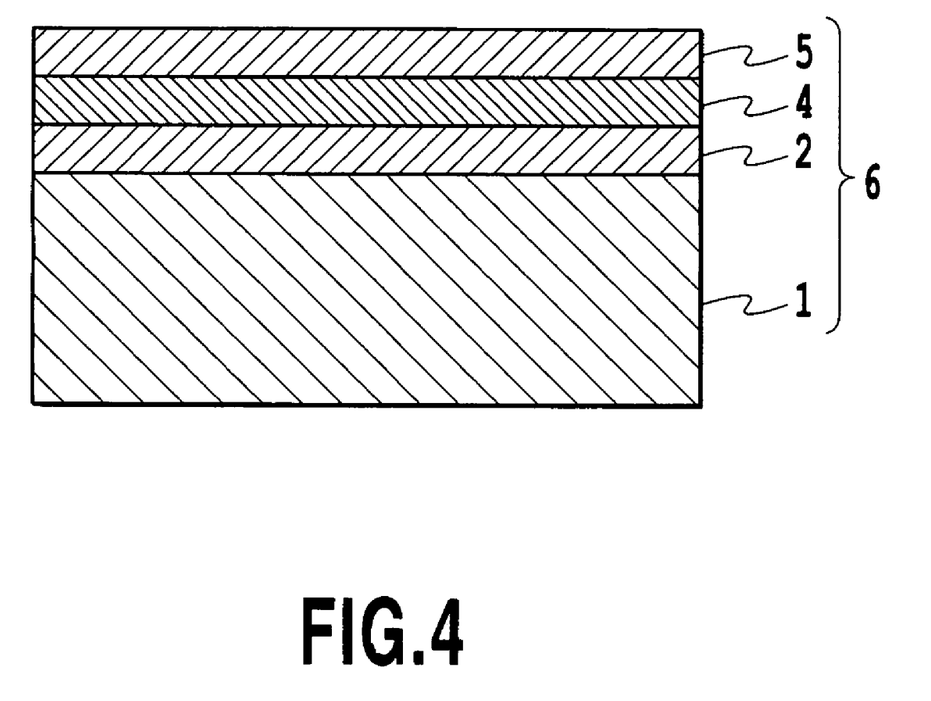
FIG. 4 is a cross-sectional schematic view of a substrate for growth of nitride semiconductor according to one embodiment of the invention.

Specifically, the invention is concerned with a layered structure of the sapphire substrate 1, the $Al_2O_3$ layer 2, the AlON layer 3, and the AlN layer 4. According to one embodiment of the invention, in the foregoing buffer layer, the layer contacting with the sapphire substrate 1 is the $Al_2O_3$ layer 2 which is not always crystalline but usually lattice-matched with the sapphire substrate in the crystalline state, whereby lattice mismatch between the sapphire substrate and the buffer layer can be reduced although the $Al_2O_3$ layer 2 is not always crystalline. Also, in the foregoing buffer layer, by deposition of the AlON layer 3 and the AlN layer 4 which are not always crystalline on the $Al_2O_3$ layer 2 to form a nitride semiconductor layer on the AlN layer 4, lattice mismatch between the buffer layer and the nitride semiconductor layer can be reduced although the AlN layer 4 is not always crystalline. Incidentally, with respect to the AlON layer 3 and the AlN layer 4, though it is the best mode that these layers are deposited in that order, similar effects can be obtained even by a structure using either one of the AlON layer 3 or the AlN layer 4 as illustrated in FIGS. 3 and 4.

In the light of the above, with respect to the buffer layer to be formed between the sapphire substrate and the nitride semiconductor, what is important in one embodiment of the invention is not only to reduce lattice mismatch of the surface contacting with the nitride semiconductor but also to separately provide a buffer layer constructed so as to reduce lattice mismatch of the surface contacting with the sapphire substrate. For achieving this matter, according to one embodiment of the invention, it is essential that in the buffer layer, the composition of nitrogen and oxygen is changed from the surface of the buffer layer contacting with the sapphire substrate toward the surface contacting with the nitride semiconductor. Namely, it is essential to separately provide a buffer layer on the sapphire substrate such that with respect to the composition of oxygen and nitrogen to be contained in the buffer layer, the buffer layer has an oxygen-rich composition in the vicinity of the surface of the buffer layer contacting with the sapphire substrate, that the buffer layer has a nitrogen-rich composition in the vicinity of the surface of the buffer layer contacting with the nitride semiconductor, and that the composition of nitrogen increases from the vicinity of the sapphire substrate toward the vicinity of the nitride semiconductor substrate.

According to one embodiment of the invention, the buffer layer may be monocrystalline or polycrystalline or may be an intermediate layer. In this description, the term "intermediate layer" as referred to herein means a layer in which single crystals, polycrystals, and amorphous crystals are mixed.

For that reason, according to one embodiment of the invention, as illustrated in FIG. 1, the buffer layer is constructed such that the $Al_2O_3$ layer 2, the AlON layer 3, and the AlN layer 4 are successively deposited and that nitrogen is increased with a gradient from the sapphire substrate 1 toward the GaN layer 7 (not illustrated in FIG. 1). Also, as illustrated in FIGS. 3 and 4, the buffer layer may be constructed such that the $Al_2O_3$ layer and either one of the AlON layer 3 or the AlN layer 4 are deposited and that the composition of nitrogen is stepwise increased from the sapphire substrate 1 toward the GaN layer 7 (not illustrated in FIGS. 3 and 4).

The $Al_2O_3$ cap layer according to one embodiment of the invention will be described below in detail.

In the case where the cap layer 5 made of $Al_2O_3$ is provided as the uppermost layer of the substrate 6 for growth of nitride semiconductor, this cap layer 5 is provided for the purpose of keeping stability against the external environment, such as one to be exposed to air. This structure is different from the structure using the buffer layer according to the related art with respect to the point of the presence or absence of the cap layer 5. What the cap layer 5 is present enables one to take out the substrate 6 for growth of nitride semiconductor into the air atmosphere outside the chamber and makes it easy to handle the substrate 6. Incidentally, it is considered that since in this $Al_2O_3$ cap layer 5 as the final layer, an atmosphere of a nitrogen-containing substance such as ammonia is used at the time of crystal growth of the nitride semiconductor, the cap layer 5 is changed into AlN which constitutes the AlN layers as its lower layer (however, illustrated as the $Al_2O_3$ cap layer 5 in FIGS. 2, 3 and 4 and FIG. 6 as described later). Namely, the cap layer 5 plays a dual role of a cap which brings about stability and a surface at the time of growth of nitride semiconductor.

Now, since the related-art growth method of nitride semiconductor includes two stages of the growth of the buffer layer as described previously and the temperature-rising and temperature-dropping process, there are encountered such problems that the growth process is complicated and that a time necessary for a process of forming a nitride semiconductor on a sapphire substrate (also referred to as "growth time" in this description) is long.

Figure 5:
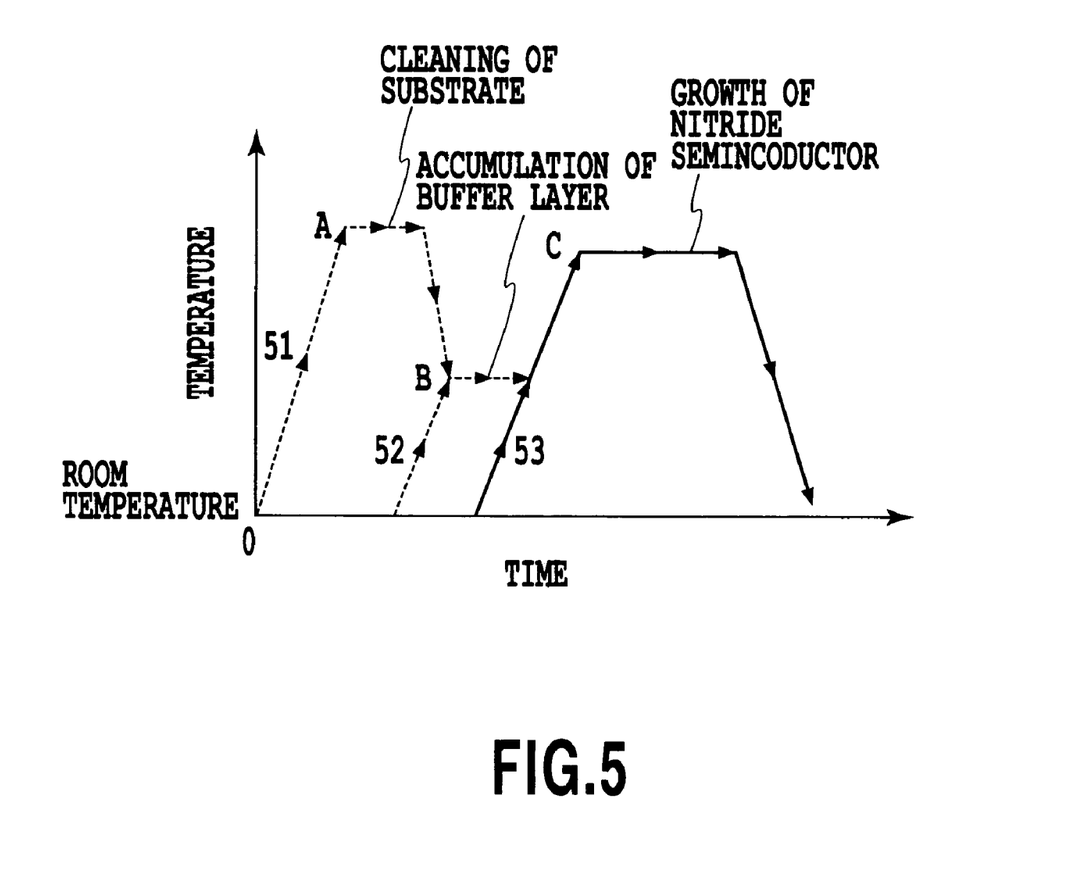
FIG. 5 is a view to explain the relationship between a time necessary for a process of forming a nitride semiconductor on a sapphire substrate and a temperature of a growth furnace.

FIG. 5 is a view to explain the relationship between a time necessary for a process of the growth of a nitride semiconductor on a sapphire substrate and a temperature of a growth furnace. In FIG. 5, reference numeral 51 shows a change with time of the temperature of a growth furnace in the related-art first process in which the temperature is raised to a temperature A (1,000° C. to 1,100° C.), thereby cleaning the sapphire substrate, and the temperature is dropped to a temperature B (400° C. to 600° C.), thereby depositing the buffer layer on the sapphire substrate. Reference numeral 52 shows a change with time of the temperature of a growth furnace in the related-art second process in which the temperature is raised to a temperature B (400° C. to 600° C.), thereby depositing the buffer layer on the sapphire substrate. Reference numeral 53 shows a change with time of the temperature of a growth furnace according to one embodiment of the invention in the third process in which the temperature is raised to a temperature C (1,000° C.), thereby growing the nitride semiconductor on the substrate for growth of nitride semiconductor.

According to the related art, in growth of the nitride semiconductor on the sapphire substrate, the first process or second process is performed, thereby forming the buffer layer on the sapphire substrate, and the third process is performed, thereby growing the nitride semiconductor on the buffer layer. At this time, as illustrated by the reference numeral 51 or the reference numeral 52, since the inside of the growth furnace is set up at high temperatures before growth of the nitride semiconductor, deterioration of the growth apparatus is promoted. It is considered that the degree of deterioration of the growth apparatus is influenced in an exponential function manner by the use temperature and use time.

On the other hand, according to one embodiment of the invention, since the substrate for growth of nitride semiconductor can be prepared at room temperature, the growth furnace does not experience the temperature change as illustrated by the reference numeral 51 or reference numeral 52. Thus, as illustrated by the reference numeral 53, the temperature-rising and temperature-dropping process for forming the buffer layer, which has hitherto been required, is not required, and by raising the temperature to the growth temperature of the nitride semiconductor (1,000° C.), it is possible to easily grow the nitride semiconductor layer. Also, since the time for keeping the temperature within the growth furnace high can be shortened as compared with the related art, it is possible to realize a long life of the mechanism for heating the substrate within the growth furnace and so on.

In particular, in the case of using the substrate for growth of nitride semiconductor having an $Al_2O_3$ cap layer as the uppermost layer, since the substrate can be exposed in the air, it becomes possible to separately form the substrate and the growth of the nitride semiconductor onto the substrate. Accordingly, in growth of the nitride semiconductor, by using the substrate for growth of nitride semiconductor having an $Al_2O_3$ cap layer as separately prepared, it is possible to omit the time for forming the buffer layer on the sapphire substrate. That is, since the procedures can be started from the third process, the growth time can be shortened, leading to an improvement of the productivity. Accordingly, it becomes possible to simplify the growth sequence and to largely shorten the growth time, these aspects having hitherto been problems.

Next, an application example of the substrate for growth of nitride semiconductor of the invention will be described below.

FIG. 6 is a cross-sectional schematic view of an $Al_{1-x}Ga_xN$ ($0 \leq x < 1$)/GaN heterojunction bipolar transistor structure having been subjected to crystal growth on the substrate for growth of nitride semiconductor of the invention.

In FIG. 6, reference numeral 9 denotes a GaN buffer layer; reference numeral 10 denotes an n$^+$-type GaN subcollector layer; reference numeral 11 denotes an n$^-$-type GaN collector layer; reference numeral 12 denotes a p-type GaN base layer; reference numeral 13 denotes an n$^-$-type $Al_{1-x}Ga_xN$ emitter layer ($0 \leq x < 1$); reference numeral 14 denotes an n$^+$-type GaN contact layer; reference numeral 15 denotes a collector electrode; reference numeral 16 denotes a base electrode; and reference numeral 17 denotes an emitter electrode.

On the substrate 6 for growth of nitride semiconductor as illustrated in the foregoing embodiment, the GaN buffer layer 9 (thickness: 1 μm), the n$^+$-type GaN subcollector layer 10 (thickness: 1 μm), the n$^-$-type GaN collector layer 11 (thickness: 0.5 μm), the p-type GaN base layer 12 (thickness: 0.08 μm), the n$^-$-type $Al_{1-x}Ga_xN$ emitter layer 13 ($0 \leq x < 1$) (thickness: 0.05 μm), and the n$^+$-type GaN contact layer 14 (thickness: 0.1 μm) were grown by the metalorganic vapor phase epitaxy. In this case, the growth sequence is a method in which the substrate 6 for growth of nitride semiconductor was introduced into a growth furnace, the temperature was then raised to the growth temperature (1,000° C.) under an ammonia atmosphere, and a source material gas was supplied. Trimethylgallium, trimethylaluminum and ammonia are used as the source materials. For dopant of n-type impurities, a silane was used. For dopant of p-type impurities, Mg was used. A mesa structure was prepared by etching, and ohmic electrodes, i.e., the collector electrode 15, the base electrode 16, and the emitter electrode 17, were formed on the each exposed layers by means of electron beam metal deposition. In a collector current-collector voltage characteristic in common emitter configuration of a fabricated transistor, current gain of approximately 100 was obtained, and the breakdown voltage was increased to approximately 200 V with a reduction of the dislocation density as described already being reflected.

The invention claimed is:

1. A substrate system for growth of a nitride semiconductor layer on a sapphire substrate, the substrate system comprising:
    an $Al_2O_3$ layer provided on the sapphire substrate; and
    a second layer including N, O and Al provided on the $Al_2O_3$ layer,
    wherein the second layer contacts with the $Al_2O_3$ layer at a first surface of the second layer and is formed such that a proportion of N to a composition ratio of N, O and Al in the first surface is smaller than that of N to the composition ratio of N, O and Al in a second surface of the second layer on which a nitride semiconductor layer is grown and a proportion of O to the composition ratio in the first surface is larger than that of O to the composition ratio in the second surface.

2. A substrate system for growth of a nitride semiconductor layer on a sapphire substrate, the substrate system comprising:
    an $Al_2O_3$ layer provided on the sapphire substrate;
    a second layer including N, O and Al provided on the $Al_2O_3$ layer; and
    a cap layer made of $Al_2O_3$ provided on the second layer, the nitride semiconductor being grown on the cap layer,
    wherein the second layer contacts with the $Al_2O_3$ layer at a first surface of the second layer and is formed such that a proportion of N to a composition ratio of N, O and Al in the first surface is smaller than that of N to the composition ratio of N, O and Al in a second surface of the second layer contacting with the cap layer and a proportion of O to the composition ratio in the first surface is larger than that of O to the composition ratio in the second surface.

3. A substrate system for growth of a nitride semiconductor layer on a sapphire substrate, the substrate system comprising:
    an $Al_2O_3$ layer provided on the sapphire substrate;
    a second layer comprising either one layer of an AlON layer or an AlN layer, the second layer being provided on said $Al_2O_3$ layer; and
    a grown nitride semiconductor layer provided on or above the second layer.

4. The substrate system according to claim 3, further comprising a cap layer made of $Al_2O_3$, the cap layer being positioned between the first layer and the nitride semiconductor layer such that the nitride semiconductor layer is grown directly on the cap layer.

5. A substrate system for growth of a nitride semiconductor layer on a sapphire substrate, the substrate system comprising:
    an $Al_2O_3$ layer provided on the sapphire substrate;
    an AlON layer provided on the $Al_2O_3$ layer;
    an AlN layer provided on the AlON layer; and
    a grown nitride semiconductor layer provided on or above the AlN layer.

6. The substrate system according to claim 5, further comprising a cap layer made of $Al_2O_3$, the cap layer being positioned between the AlN layer and the nitride semiconductor layer such that the nitride semiconductor layer is grown directly on the cap layer.

7. A substrate system for growth of a nitride semiconductor layer on a sapphire substrate, the substrate system comprising:
    a first layer comprised of $Al_2O_3$, the first layer being disposed against the sapphire substrate at a first surface; and a second layer including N, O and Al, the second layer being disposed on the first layer, the second layer being disposed against a grown nitride semiconductor layer at a second surface, wherein a proportion of N to a composition ratio of N, O and Al in the first surface is smaller than a proportion of N to the composition ratio of N, O and Al in the second surface and a proportion of O to the composition ratio of N, O and Al in the first surface is larger than a proportion of O to the composition ratio of N, O and Al in the second surface.

8. A substrate system for growth of a nitride semiconductor layer on a sapphire substrate, the substrate system comprising:

a first layer comprised of $Al_2O_3$, the first layer being disposed against the sapphire substrate at a first surface;

a second layer including N, O and Al, the second layer being disposed on the first layer; and a cap layer made of $Al_2O_3$ provided on the second layer, the second layer being disposed against the cap layer at a second surface and the nitride semiconductor being grown on the cap layer, wherein a proportion of N to a composition ratio of N, O and Al in the first surface is smaller than a proportion of N to the composition ratio of N, O and Al in the second surface and a proportion of O to the composition ratio of N, O and Al in the first surface is larger than a proportion of O to the composition ratio of N, O and Al in the second surface.

* * * * *